United States Patent
Terashima et al.

(10) Patent No.: US 11,923,115 B2
(45) Date of Patent: Mar. 5, 2024

(54) INSULATING COATING-ATTACHED ELECTRICAL STEEL SHEET AND MANUFACTURING METHOD THEREFOR

(71) Applicant: JFE STEEL CORPORATION, Tokyo (JP)

(72) Inventors: Takashi Terashima, Tokyo (JP); Masahiro Suemune, Tokyo (JP); Karin Kokufu, Tokyo (JP); Toshito Takamiya, Tokyo (JP)

(73) Assignee: JFE STEEL CORPORATION, Tokyo (JP)

( * ) Notice: Subject to any disclaimer, the term of this patent is extended or adjusted under 35 U.S.C. 154(b) by 882 days.

(21) Appl. No.: 16/967,945

(22) PCT Filed: Jan. 21, 2019

(86) PCT No.: PCT/JP2019/001690
§ 371 (c)(1),
(2) Date: Aug. 6, 2020

(87) PCT Pub. No.: WO2019/155858
PCT Pub. Date: Aug. 15, 2019

(65) Prior Publication Data
US 2021/0035718 A1 Feb. 4, 2021

(30) Foreign Application Priority Data

Feb. 6, 2018 (JP) .................... 2018-018756

(51) Int. Cl.
*B32B 15/04* (2006.01)
*B32B 17/06* (2006.01)
(Continued)

(52) U.S. Cl.
CPC .......... *H01F 1/147* (2013.01); *C23C 22/82* (2013.01); *C23C 28/04* (2013.01); *C22C 38/001* (2013.01);
(Continued)

(58) Field of Classification Search
CPC ................................. C23C 18/1241
(Continued)

(56) References Cited

U.S. PATENT DOCUMENTS

2003/0180553 A1* 9/2003 Shigesato ............ C21D 8/1272
427/127
2008/0190520 A1* 8/2008 Watanabe ............... C23C 22/74
148/320

(Continued)

FOREIGN PATENT DOCUMENTS

CN 107429401 A 12/2017
EP 2096185 A1 9/2009
(Continued)

OTHER PUBLICATIONS

Dec. 20, 2021 Office Action Issued in European Patent Application No. 19 751 911.9.
(Continued)

*Primary Examiner* — Lauren R Colgan
(74) *Attorney, Agent, or Firm* — Oliff PLC

(57) ABSTRACT

An insulating coating-attached electrical steel sheet has, on at least one surface, an insulating coating including an insulating tensile coating layer A. A tension applied to the steel sheet by an insulating tensile coating layer having a coating weight of M/2 from a surface of the insulating tensile coating layer A is $0.80 \times \sigma_A$ or more, where M is a weight of the insulating tensile coating layer A, and $\sigma_A$ is the tension applied to the steel sheet by the insulating tensile coating layer A. The insulating coating-attached electrical
(Continued)

steel sheet has excellent adhesion of the insulating coating. A method for manufacturing the insulating coating-attached electrical steel sheet is also provided.

8 Claims, 1 Drawing Sheet

(51) Int. Cl.
| | |
|---|---|
| *C23C 22/82* | (2006.01) |
| *C23C 28/04* | (2006.01) |
| *H01F 1/147* | (2006.01) |
| *C22C 38/00* | (2006.01) |
| *C22C 38/02* | (2006.01) |
| *C22C 38/04* | (2006.01) |
| *C22C 38/06* | (2006.01) |
| *C22C 38/16* | (2006.01) |
| *C23C 18/12* | (2006.01) |

(52) U.S. Cl.
CPC .............. *C22C 38/02* (2013.01); *C22C 38/04* (2013.01); *C22C 38/06* (2013.01); *C22C 38/16* (2013.01); *C22C 2202/02* (2013.01); *C23C 18/1212* (2013.01); *C23C 18/1241* (2013.01); *C23C 18/127* (2013.01)

(58) Field of Classification Search
USPC ................................................ 428/699, 432
See application file for complete search history.

(56) References Cited

U.S. PATENT DOCUMENTS

| | | | | |
|---|---|---|---|---|
| 2009/0233114 | A1* | 9/2009 | Takeda ................ | C23C 22/20 |
| | | | | 427/343 |
| 2012/0305140 | A1* | 12/2012 | Yamazaki .......... | H01F 1/14783 |
| | | | | 148/285 |
| 2013/0143003 | A1* | 6/2013 | Takenaka .............. | C21D 10/00 |
| | | | | 428/174 |
| 2014/0272399 | A1* | 9/2014 | Bohm .................... | H01F 1/18 |
| | | | | 427/104 |
| 2016/0260531 | A1* | 9/2016 | Terashima ........... | C21D 8/1283 |
| 2018/0230565 | A1* | 8/2018 | Watanabe ............ | C21D 8/1283 |

FOREIGN PATENT DOCUMENTS

| | | |
|---|---|---|
| EP | 3048180 A1 | 7/2016 |
| EP | 3064607 A1 | 9/2016 |
| EP | 3 276 043 A1 | 1/2018 |
| JP | S48-39338 A | 6/1973 |
| JP | S50-79442 A | 6/1975 |
| JP | S63-111604 A | 5/1988 |
| JP | H08-67913 A | 3/1996 |
| JP | H09-78253 A | 3/1997 |
| JP | H10-330951 A | 12/1998 |
| JP | H11-12755 A | 1/1999 |
| JP | H11-302857 A | 11/1999 |
| JP | 2002-60957 A | 2/2002 |
| JP | 2002-309381 A | 10/2002 |
| JP | 2003-301272 A | 10/2003 |
| JP | 2007-217758 A | 8/2007 |
| JP | 2017-61732 A | 3/2017 |
| RU | 2405842 C1 | 12/2010 |
| RU | 2621523 C1 | 6/2017 |
| RU | 2639178 C2 | 12/2017 |
| WO | 2017/057513 A1 | 4/2017 |

OTHER PUBLICATIONS

Aug. 1, 2022 Office Action issued in Korean Patent Application No. 10-2020-7022636.
Apr. 16, 2019 International Search Report issued in International Patent Application No. PCT/JP2019/001690.
Oct. 14, 2020 extended European Search Report issued in European Patent Application No. 19751911.9.
Aug. 16, 2021 Office Action issued in Chinese Patent Application No. 201980012105.X.
Apr. 20, 2020 Office Action issued in Japanese Patent Application No. 2019-524295.
Nov. 12, 2020 Office Action issued in Russian Patent Application No. 2020126233.

* cited by examiner

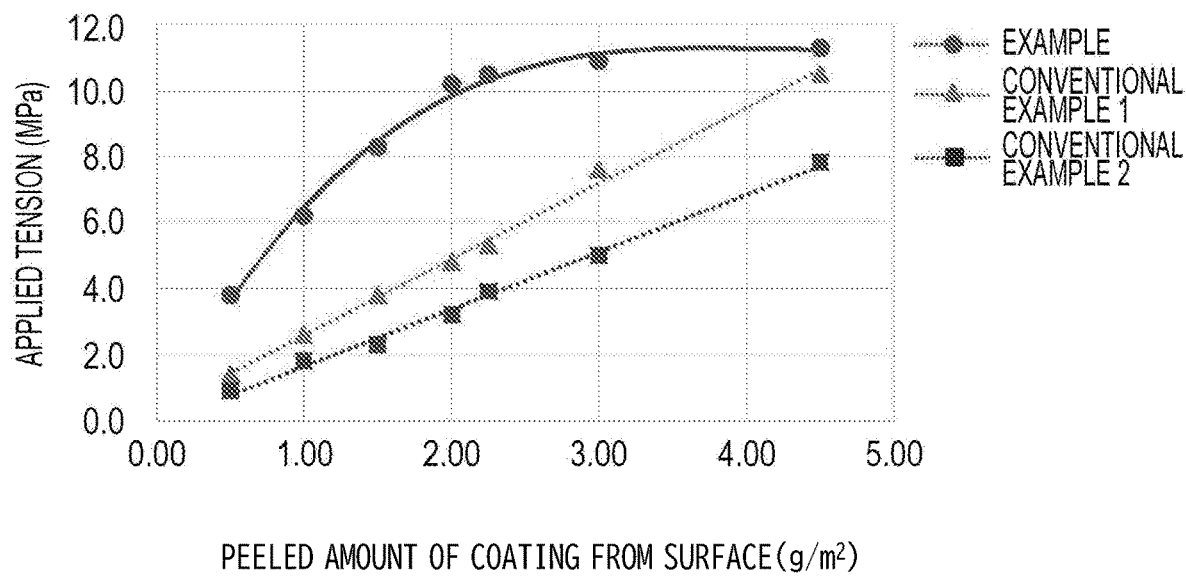

INSULATING COATING-ATTACHED ELECTRICAL STEEL SHEET AND MANUFACTURING METHOD THEREFOR

TECHNICAL FIELD

The disclosure relates to an insulating coating-attached electrical steel sheet and a manufacturing method therefor. Especially, the disclosure relates to an insulating coating-attached electrical steel sheet having excellent adhesion of the insulating coating as well as large coating tension and particularly relates to an insulating coating-attached grain-oriented electrical steel sheet.

BACKGROUND

Electrical steel sheets are soft magnetic materials widely used as core materials of rotors and stators. In particular, grain-oriented electrical steel sheets are soft magnetic materials used as core materials of transformers and generators and have a crystal structure in which the <001> directions, which are axes of easy magnetization of iron, are highly aligned in the rolling direction of the steel sheets. Such texture is formed, in the manufacturing process of grain-oriented electrical steel sheets, through secondary recrystallization that preferentially grows huge crystal grains with (110)[001] orientation, so-called Goss orientation, during secondary recrystallization annealing.

In general, a grain-oriented electrical steel sheet is provided with an insulating coating consisting of two layers: a layer primarily containing forsterite (forsterite coating layer) on the contact side with the steel sheet and a layer primarily containing silicophosphate glass (insulating tensile coating layer). The silicophosphate glass coating is designed to impart insulation, workability, rust prevention, and so forth. However, due to low adhesion between glass and metal, a ceramic layer primarily containing forsterite is commonly formed between the insulating tensile coating layer and the steel sheet. An insulating coating with such a composition is formed at a high temperature and has a thermal expansion coefficient lower than a steel sheet. Accordingly, the insulating coating effectively applies a tension to the steel sheet due to a difference in thermal expansion coefficient between the steel sheet and the insulating coating when the temperature is lowered to room temperature, thereby reducing iron loss. Moreover, it is also preferable to apply tensile stress to a non-oriented electrical steel sheet as well to suppress deterioration in characteristics due to compressive stress. For these reasons, in the field of electrical steel sheets, particularly, in the field of grain-oriented electrical steel sheets, it is desired to apply a tension to steel sheets as high as possible, for example, 8 MPa or higher as in Patent Literature 1.

To satisfy such needs, various vitreous coatings have been proposed. For example, Patent Literature 2 proposes a coating primarily containing magnesium phosphate, colloidal silica, and chromic anhydride, and Patent Literature 3 proposes a coating primarily containing aluminum phosphate, colloidal silica, and chromic anhydride. Moreover, Patent Literature 4 discloses a technique of preventing sticking during stress relief annealing and preventing deterioration in coating adhesion. Further, as a technique of forming a further high-tensile coating to improve magnetic characteristics, Patent Literature 5 discloses a technique of crystallizing glass.

CITATION LIST

Patent Literature

PTL 1: Japanese Unexamined Patent Application Publication No. 8-67913
PTL 2: Japanese Unexamined Patent Application Publication No. 50-79442
PTL 3: Japanese Unexamined Patent Application Publication No. 48-39338
PTL 4: Japanese Unexamined Patent Application Publication No. 63-111604
PTL 5: Japanese Unexamined Patent Application Publication No. 2007-217758

SUMMARY

Technical Problem

By selecting an appropriate crystal phase (in other words, crystals with a low thermal expansion coefficient), it is possible to obtain a high-tensile insulating coating and advantageously improve magnetic characteristics. Meanwhile, it was found that an excessively large difference in thermal expansion coefficient between a steel sheet and an insulating coating generates a large shear stress at the interface between the insulating coating and the steel sheet or the interface between an insulating tensile coating layer and a forsterite coating layer and tends to cause a problem, particularly during manufacture of a wound core, in which a coating is peeled off in the innermost wound part.

An object of the disclosure is to provide an insulating coating-attached electrical steel sheet having excellent adhesion of the insulating coating and a manufacturing method therefor.

Solution to Problem

The present inventors closely investigated peeled sites of coatings when grain-oriented electrical steel sheets on which insulating coatings with a tension enhanced by utilizing crystallization had been formed were bent. As a result, the coatings were found to be peeled off at the interface between an insulating tensile coating layer (hereinafter, also referred to as insulating tensile coating layer A) and a forsterite coating layer (hereinafter, also referred to as insulating coating layer B). On the basis of the investigated result, the present inventors intensively studied a method of preventing peeling off of coatings and found that the peeling can be avoided by reducing shear stress generated at the interface between the insulating tensile coating layer A and the insulating coating layer B (hereinafter, referred to as coating layer A/B interface). For this purpose, a method of newly interposing an intermediate layer C between the coating layers A and B is possible. However, this method is disadvantageous in terms of manufacturing costs since one more step is needed to form an insulating coating. For this reason, the present inventors intensively studied a method of enhancing a tension applied to a steel sheet by an insulating tensile coating layer A while reducing shear stress at the coating layer A/B interface without increasing steps for forming an insulating coating. As a result, the present inventors successfully achieved extremely low thermal expansion on the surface layer side and low thermal expansion comparable to conventional coatings on the coating layer A/B interface side of the insulating tensile coating layer A by forming, in the coating thickness direction, a concentration gradient in the distribution of crystalized phases within the insulating tensile coating layer A, thereby completing the disclosure.

Specifically, the disclosure includes the following embodiments.

[1] An insulating coating-attached electrical steel sheet having, on at least one surface, an insulating coating including an insulating tensile coating layer A, where: when a weight of the insulating tensile coating layer A is denoted by M and a tension applied to the steel sheet by the insulating tensile coating layer A is denoted by $\sigma_A$, a tension applied to the steel sheet by an insulating tensile coating layer having a coating weight of M/2 from a surface of the insulating tensile coating layer A is 0.80× $\sigma_A$ or more.

[2] The insulating coating-attached electrical steel sheet according to [1], where the insulating tensile coating layer A primarily contains glass or glass ceramics.

[3] The insulating coating-attached electrical steel sheet according to [1] or [2], where the insulating tensile coating layer A is silicophosphate glass or silicophosphate glass ceramics containing one or more elements selected from Mg, Al, Ca, Ba, Sr, Zn, Ti, Nd, Mo, Cr, B, Ta, Cu, and Mn.

[4] A manufacturing method for an insulating coating-attached electrical steel sheet having, on at least one surface, an insulating coating including an insulating tensile coating layer A, where: when a weight of the insulating tensile coating layer A is denoted by M and a tension applied to the steel sheet by the insulating tensile coating layer A is denoted by $\sigma_A$, a tension applied to the steel sheet by an insulating tensile coating layer having a coating weight of M/2 from a surface of the insulating tensile coating layer A is 0.80× $\sigma_A$ or more; and the insulating tensile coating layer A is formed by applying a treatment solution for coating formation containing colloidal silica and at least one selected from Mg, Al, Ca, Ba, Sr, Zn, Ti, Nd, Mo, Cr, Ta, Cu, and Mn salts of phosphoric acid, boric acid, and silicic acid to at least either surface of an electrical steel sheet, subsequently heating at a heating rate of 100° C./s or more in a temperature range of 600° C. or higher and 700° C. or lower, and then baking at 800° C. or higher.

[5] A manufacturing method for an insulating coating-attached electrical steel sheet having, on at least one surface, an insulating coating including an insulating tensile coating layer A; where: when a weight of the insulating tensile coating layer A is denoted by M and a tension applied to the steel sheet by the insulating tensile coating layer A is denoted by $\sigma_A$, a tension applied to the steel sheet by an insulating tensile coating layer having a coating weight of M/2 from a surface of the insulating tensile coating layer A is 0.80× $\sigma_A$ or more; and the insulating tensile coating layer A is formed by applying a treatment solution for coating formation containing colloidal silica, at least one selected from Mg, Al, Ca, Ba, Sr, Zn, Cr, and Mn salts of phosphoric acid, and a compound containing one or more selected from Ti, Nd, Mo, B, Ta, and Cu to at least either surface of an electrical steel sheet, subsequently heating at a heating rate of 100° C./s or more in a temperature range of 600° C. or higher and 700° C. or lower, and then baking at 800° C. or higher.

[6] The manufacturing method for an insulating coating-attached electrical steel sheet according to [4] or [5], where an atmosphere in a temperature range of 700° C. or higher is an atmosphere with a dew point of –20° C. or higher and 10° C. or lower.

Advantageous Effects

According to the disclosure, it is possible to obtain an insulating coating-attached electrical steel sheet having excellent adhesion of the insulating coating.

According to the disclosure, it is possible to obtain an insulating coating-attached electrical steel sheet having excellent adhesion of the insulating coating as well as large coating tension. According to the disclosure, it is possible to obtain an insulating coating-attached electrical steel sheet that can enhance a tension applied to the steel sheet by the insulating coating when an insulating tensile coating layer with low thermal expansion is formed and that exhibits excellent coating adhesion in the innermost wound part when formed into a wound core.

BRIEF DESCRIPTION OF DRAWINGS

FIG. 1 is a graph showing the relationship between the peeled amount of insulating tensile coating layer A and applied tension for Conventional Example 1, Conventional Example 2, and the Example.

DETAILED DESCRIPTION

Hereinafter, the experimental results that underlie the disclosure will be described.

First, samples were produced as follows.

A finish-annealed 0.23 mm-thick grain-oriented electrical steel sheet manufactured by a publicly known method was sheared into a size of 300 mm×100 mm and subjected, after removal of an unreacted annealing separator, to stress relief annealing (800° C., 2 hours, $N_2$ atmosphere). On the surface of the steel sheet after stress relief annealing, a coating primarily containing forsterite (insulating coating layer B) was formed. Subsequently, the steel sheet was lightly pickled with a 5 mass % phosphoric acid aqueous solution. An insulating coating was then formed as follows on the lightly pickled steel sheet.

(Conventional Example 1) By providing, as described in Patent Literature 5, an insulating tensile coating of Example 4 of Patent Literature 5, the insulating tensile coating (insulating tensile coating layer A) was formed on the insulating coating layer B (forsterite coating).

(Conventional Example 2) By providing, as described in Patent Literature 4, an insulating tensile coating No. 3 in Table 2 of Example 1, which is an example of the invention disclosed in Patent Literature 4, the insulating tensile coating (insulating tensile coating layer A) was formed on the insulating coating layer B (forsterite coating).

(Example) An aqueous solution was prepared by mixing 100 parts by mass (as solids content) of a magnesium dihydrogen phosphate aqueous solution, 50 parts by mass (as solids content) of colloidal silica, and 50 parts by mass (as solids content) of magnesium nitrate hexahydrate. The aqueous solution was diluted with pure water and adjusted to a specific gravity of 1.20 to prepare a treatment solution for coating formation. The resulting treatment solution was applied at a coating weight after drying of 9.00 g/m² for both surfaces (4.50 g/m² for each surface) by using a roll coater. Subsequently, the steel sheet was placed in a drying furnace (300° C., 1 min), heated at a heating rate of 150° C./s in the temperature range of 600° C. to 700° C., and then baked under conditions of 850° C., 30 seconds, 100% $N_2$, and a dew point of –10° C. to form an insulating tensile coating layer A on the insulating coating layer B (forsterite coating).

Here, in all the samples of Conventional Example 1, Conventional Example 2, and the Example, the weight after drying of the insulating tensile coating layer A was adjusted to 4.50 g/m² per surface.

For the thus-obtained samples, the distribution, within the insulating tensile coating layer A, of a tension applied to the steel sheet by the insulating tensile coating layer A was determined by removing the insulating tensile coating layer A at various removal rates from one surface of a sample and by measuring the amount of the removed/peeled insulating tensile coating layer A and the corresponding applied tension. A method of removing, at various removal rates, the insulating tensile coating layer A only from one surface of a sample was performed by masking the insulating coating on the other surface with an adhesive tape such that the insulating coating on the other surface is not removed and then adjusting an immersion time in a 25 mass % NaOH aqueous solution at 110° C.

The peeled amount ($g/m^2$) of the insulating tensile coating layer A was calculated from a difference in mass (g) of a sample before and after peeling of the coating and the surface area ($m^2$) on one surface of the sample.

A tension applied to a steel sheet was defined as a tension in the rolling direction and obtained by: preparing specimens (280 mm in the rolling direction×30 mm in the transverse direction) from a sample in which the insulating tensile coating layer A had been removed from one surface at various removal rates; measuring a warpage for each specimen while fixing a 30 mm-portion in one end of the specimen and leaving a 250 mm-portion of the specimen as a measurement length; and calculating by using the following formula (I).

Tension applied to steel sheet [MPa]=Young's modulus of steel sheet [GPa]×sheet thickness [mm]× warpage [mm]/(measurement length [mm])$^2$× $10^3$   Formula (I)

where Young's modulus of steel sheet is set to 132 GPa.

Further, the adhesion of the insulating coating of each sample was assessed as "poor" for the peeled coating and "satisfactory" for the unpeeled coating when a test material (280 mm in the rolling direction×30 mm in the transverse direction) was wound around a 10 mm-diameter round bar and then bent back by 180°.

Table 1 shows the peeled amount of the insulating tensile coating layer A and an applied tension measured at the corresponding peeled amount, as well as the assessment result of the coating adhesion for each sample.

TABLE 1

|  |  | Applied tension (MPa) | | |
| --- | --- | --- | --- | --- |
|  |  | Conventional Example 1 | Conventional Example 2 | Example |
| Peeled amount of insulating tensile coating layer A from one surface ($g/m^2$) | 0.50 | 1.4 | 0.9 | 3.8 |
|  | 1.00 | 2.6 | 1.8 | 6.2 |
|  | 1.50 | 3.8 | 2.3 | 8.3 |
|  | 2.00 | 4.8 | 3.2 | 10.2 |
|  | 2.25 | 5.3 | 3.9 | 10.5 |
|  | 3.00 | 7.6 | 5.0 | 10.9 |
|  | 4.50 | 10.5 | 7.8 | 11.3 |
| Coating adhesion (10 mmφ) | | Poor | Poor | Satisfactory |

As shown in Table 1, when the peeled amount of the insulating tensile coating layer A was 0.50 $g/m^2$, an applied tension was 1.4 MPa in Conventional Example 1, 0.9 MPa in Conventional Example 2, and 3.8 MPa in the Example. The applied tension corresponds to a tension applied to the steel sheet by an insulating tensile coating layer with a coating weight of 0.50 $g/m^2$ from the surface of the insulating tensile coating layer A (in other words, when the weight of the insulating tensile coating layer A on one surface is denoted by M, corresponding to a tension applied to the steel sheet by an insulating tensile coating layer with a coating weight of M/9 from the surface).

The same view as the above-described case in which the peeled amount of the insulating tensile coating layer A is 0.50 $g/m^2$ is applicable to the cases in which the peeled amount of the insulating tensile coating layer A is 1.00, 1.50, 2.00, 2.25, 3.00, and 4.50 $g/m^2$, respectively.

For example, when the peeled amount of the insulating tensile coating layer A is 2.25 $g/m^2$, an applied tension is 5.3 MPa in Conventional Example 1, 3.9 MPa in Conventional Example 2, and 10.5 MPa in the Example. The applied tension corresponds to a tension applied to the steel sheet by an insulating tensile coating layer with a coating weight of 2.25 $g/m^2$ from the surface of the insulating tensile coating layer A (in other words, when the weight of the insulating tensile coating layer A on one surface is denoted by M, corresponding to a tension applied to the steel sheet by an insulating tensile coating layer with a coating weight of M/2 from the surface).

Moreover, when the peeled amount of the insulating tensile coating layer A is 4.50 $g/m^2$, an applied tension is 10.5 MPa in Conventional Example 1, 7.8 MPa in Conventional Example 2, and 11.3 MPa in the Example. The applied tension corresponds to a tension applied to the steel sheet by an insulating tensile coating layer with a coating weight of 4.50 $g/m^2$ from the surface of the insulating tensile coating layer A, in other words, the entire insulating tensile coating layer A.

The data in Table 1 above are shown in FIG. 1 as a relationship between the peeled amount of the insulating tensile coating layer A and applied tension for each of the Example, Conventional Example 1, and Conventional Example 2, where the horizontal axis represents the peeled amount of the insulating tensile coating layer A and the vertical axis represents an applied tension at the corresponding peeled amount.

As shown in Table 1 and FIG. 1, it is revealed that the Example has a gradient in the applied tension within the insulating tensile coating layer A and the distribution of the applied tension within the insulating tensile coating layer A considerably different from those of the Conventional Examples. In other words, the Conventional Examples exhibit an almost proportional relationship between the peeled amount of the insulating tensile coating layer A and applied tension whereas the Example lacks a proportional relationship between the peeled amount of the insulating tensile coating layer A and applied tension, but rather exhibits unevenness in the applied tension in the thickness direction of the insulating tensile coating layer A.

Moreover, the Example, in which a tension applied to the steel sheet has a gradient within the insulating tensile coating layer A as described above, is revealed to exhibit a better tension of 11.3 MPa by the entire insulating tensile coating layer A than the Conventional Examples (Conventional Example 1: 10.5 MPa, Conventional Example 2: 7.8 MPa) as well as good coating adhesion.

Next, the disclosed features will be described.

An electrical steel sheet of the disclosure may be either of a grain-oriented electrical steel sheet and a non-oriented electrical steel sheet manufactured by a publicly known method. Such a grain-oriented electrical steel sheet is preferably manufactured by the following method, for example.

First, a preferable component composition of steel will be described. Hereinafter, the symbol "%" as a unit denoting the content of each element means mass % unless otherwise stated.

C: 0.001 to 0.10%

C is a useful component for generating Goss grains. To effectively exert such an effect, 0.001% or more of C is preferably contained. Meanwhile, when C content exceeds 0.10%, insufficient decarburization could result even through decarburization annealing. Accordingly, C content is preferably within the range of 0.001 to 0.10%.

Si: 1.0 to 5.0%

Si is a component necessary for increasing electric resistance to reduce iron loss and stabilizing the BCC structure of iron to allow high-temperature heat treatment. At least 1.0% of Si is preferably contained. Meanwhile, Si content exceeding 5.0% could make cold rolling difficult. Accordingly, Si content is preferably within the range of 1.0 to 5.0% and more preferably within the range of 2.0 to 5.0%.

Mn: 0.01 to 1.0%

Mn not only effectively contributes to reduced hot shortness of steel but also functions as a grain growth inhibitor through formation of precipitates, such as MnS and MnSe, when S and Se coexist. When Mn content is less than 0.01%, the above-mentioned effects are unsatisfactory. Meanwhile, Mn content exceeding 1.0% could increase the grain size of precipitates, such as MnSe, thereby losing the effect as an inhibitor. Accordingly, Mn content is preferably within the range of 0.01 to 1.0%.

sol. Al: 0.003 to 0.050%

Al is a useful component that forms AlN in steel and performs an inhibitor function as a dispersed second phase. When the amount added is less than 0.003%, it could be impossible to ensure a sufficient amount of precipitates. Meanwhile, when more than 0.050% of Al is added, the function as an inhibitor could be lost due to coarsely precipitated AlN. Accordingly, Al content as sol. Al is preferably within the range of 0.003 to 0.050%.

N: 0.001 to 0.020%

N is also a component required to form AlN in the same manner as Al. When the amount added is less than 0.001%, AlN could be precipitated insufficiently. Meanwhile, more than 0.020% of N is added, swelling or the like could result during slab heating. Accordingly, N content is preferably within the range of 0.001 to 0.020%.

Total of one or two selected from S and Se: 0.001 to 0.05%

S or Se is a useful component that forms MnSe, MnS, $Cu_2$-xSe, or $Cu_2$-xS through bonding with Mn or Cu and performs an inhibitor function as a dispersed second phase in steel. When the total content of S and Se is less than 0.001%, the effect of addition is poor. Meanwhile, the total content exceeding 0.05% could only result in incomplete dissolution during slab heating but also cause defects on a product surface. Accordingly, the content of one or two selected from S and Se, in either case of separate addition of S or Se alone or combined addition thereof (use of S and Se in combination), preferably falls within the range of 0.001 to 0.05% in total.

The above-described components are preferably base components of steel. In addition, the composition may contain Fe and incidental impurities as the balance.

Moreover, one or more selected from Cu: 0.01 to 0.2%, Ni: 0.01 to 0.5%, Cr: 0.01 to 0.5%, Sb: 0.01 to 0.1%, Sn: 0.01 to 0.5%, Mo: 0.01 to 0.5%, and Bi: 0.001 to 0.1% may be further added to the above-described composition. Here, it is possible to further improve magnetic properties through addition of an element that acts as an auxiliary inhibitor. The above-mentioned elements are examples of such an element in terms of grain size and tendency toward surface segregation. In any of these elements, when the content is less than the above-mentioned addition amount, the effect cannot be obtained. Moreover, the above-mentioned range is preferable since defective coating appearance and/or secondary recrystallization failure tend to occur when the content exceeds the above-mentioned addition amount.

Further, in addition to the above-mentioned components, one or two or more selected from B: 0.001 to 0.01%, Ge: 0.001 to 0.1%, As: 0.005 to 0.1%, P: 0.005 to 0.1%, Te: 0.005 to 0.1%, Nb: 0.005 to 0.1%, Ti: 0.005 to 0.1%, and V: 0.005 to 0.1% may be added to steel. By addition of one or two or more of these elements, it is possible to further increase inhibitory power against grain growth, thereby achieving higher magnetic flux density in a stable manner.

Next, a manufacturing method for an insulating coating-attached electrical steel sheet will be described.

Steel having the above-described component composition is refined by a conventionally known refining process and formed into a steel slab by continuous casting or ingot casting and slabbing. The steel slab is then hot rolled into a hot-rolled sheet, subjected to annealing as necessary, and cold rolled once or twice or more via intermediate annealing into a cold-rolled sheet having a final sheet thickness. Subsequently, an insulating coating-attached electrical steel sheet can be manufactured by a manufacturing method consisting of a series of steps of: subjecting the cold-rolled sheet to primary recrystallization annealing and decarburization annealing; then applying an annealing separator containing MgO as a main component; subjecting to final finish annealing to form a coating layer primarily containing forsterite (forsterite coating layer) as an insulating coating layer B; and then forming an insulating tensile coating layer (insulating tensile coating layer A). On the surface of the thus-manufactured insulating coating-attached electrical steel sheet, an additional coating may be appropriately provided, for example, by applying a vanish or the like.

Moreover, by applying an annealing separator primarily containing $Al_2O_3$ or the like after the above-mentioned decarburization annealing without forming a forsterite coating layer after the final finish annealing, another primer coating layer may be formed later by a method, such as CVD, PVD, sol-gel process, or steel sheet oxidation. And an insulating tensile coating layer (insulating tensile coating layer A) may be formed on such a primer coating layer.

Further, by employing CVD or PVD as described hereinafter, it is also possible to form a film of Al, Cr, Ti, V, Mn, Nb, Hf, Ta, W, a nitride thereof, an oxide thereof, an oxynitride thereof, or a carbonitride thereof while varying the composition or concentration in the film thickness direction, thereby forming an insulating tensile coating layer (insulating tensile coating layer A), such as a ceramic layer with varying thermal expansion coefficient in the film thickness direction or a ceramic layer with a continuously changing composition. The thus-formed insulating tensile coating layer A has excellent adhesion with the base steel. Accordingly, the insulating tensile coating layer A can be formed directly on the base steel without forming above-described primer coating layer.

As in the foregoing, an insulating tensile coating layer A according to the disclosure has a gradient in applied tension in the thickness direction of the insulating tensile coating layer A. An insulating coating-attached electrical steel sheet of the disclosure has an insulating coating including the insulating tensile coating layer A on the surface of the electrical steel sheet. The insulating coating may be solely formed of the insulating tensile coating layer A or may be provided with a primer coating, such as a forsterite coating layer, between the insulating tensile coating layer A and the steel sheet. Further, an insulating coating-attached electrical steel sheet of the disclosure may be a product without further processing or may be a product after further providing a coating thereon formed by applying a varnish or the like. Here, the above-mentioned primer coating and coating formed by applying a varnish or the like do not exhibit a gradient in applied tension in the thickness direction as in the insulating tensile coating layer A of the disclosure.

As in the foregoing, an insulating coating-attached electrical steel sheet of the disclosure has, on at least one surface of the electrical steel sheet, an insulating coating including an insulating tensile coating layer A. When a weight of the insulating tensile coating layer A is denoted by M and a tension applied to the steel sheet by the insulating tensile coating layer A is denoted by $\sigma_A$, the electrical steel sheet is characterized in that a tension applied to the steel sheet by an insulating tensile coating layer having a coating weight of M/2 from the surface of the insulating tensile coating layer A is 0.80× $\sigma_A$ or more.

In the disclosure, a tension applied to the steel sheet by the insulating tensile coating layer A is defined as a tension in the rolling direction and obtained by: preparing a specimen (280 mm in the rolling direction×30 mm in the transverse direction) from an insulating coating-attached electrical steel sheet; removing an insulating tensile coating layer A on either surface with an alkali, an acid, or the like while masking the other surface with an adhesive tape; subsequently measuring a warpage while fixing a 30 mm-portion in one end of the specimen and leaving a 250 mm-portion of the specimen as a measurement length; and calculating by using the following formula (I).

Tension applied to steel sheet [MPa]=Young's modulus of steel sheet [GPa]×sheet thickness [mm]× warpage [mm]/(measurement length [mm])$^2$× 10$^3$     Formula (I)

where the Young's modulus of steel sheet is set to 132 GPa.

On this occasion, by removing the insulating tensile coating layer A from one surface of the specimen at various removal rates and measuring an applied tension at each removal rate, it is possible to obtain the distribution, within the insulating tensile coating layer A, of a tension applied to the steel sheet by the insulating tensile coating layer A. The removal rates can be suitably controlled, for example, by adjusting immersion conditions of one surface of the specimen in a remover (immersion time in a 25 mass % NaOH aqueous solution at 110° C., for example) when the insulating tensile coating layer A is peeled from one surface of the specimen.

Here, when a weight of the insulating tensile coating layer A on one surface of the specimen is denoted by M, for example, an applied tension measured after an insulating tensile coating layer having a coating weight of M/3 is peeled from one surface of the specimen corresponds to a tension applied to the steel sheet by the insulating tensile coating layer having a coating weight of M/3 from the surface of the insulating tensile coating layer A, and an applied tension measured after an insulating tensile coating layer having a coating weight of M/2 is peeled corresponds to a tension applied to the steel sheet by the insulating tensile coating layer having a coating weight of M/2 from the surface of the insulating tensile coating layer A. Further, an applied tension at a coating weight of M, in other words, measured after the insulating tensile coating layer A is completely peeled from one surface of the specimen corresponds to a tension $\sigma_A$ applied to the steel sheet by the entire insulating tensile coating layer A.

The coating weight, M (g/m$^2$), can be calculated from a difference in mass (g) before and after peeling of the insulating tensile coating layer A and a surface area (m$^2$) on one surface of the steel sheet.

In the disclosure, when a weight of an insulating tensile coating layer A is denoted by M and a tension applied to the steel sheet by the insulating tensile coating layer A is denoted by $\sigma_A$, a tension ($\sigma_{A/2}$) applied to the steel sheet by an insulating tensile coating layer having a coating weight of M/2 from the surface of the insulating tensile coating layer A needs to be 0.80 times or more of $\sigma_A$. When $\sigma_{A/2}$ is less than 0.80 times, a tension ($\sigma_A$-$\sigma_{A/2}$) applied to the steel sheet by the half of the insulating tensile coating layer A on the steel sheet side is still high, thereby increasing a shear stress at the coating interface (the interface between the insulating tensile coating layer A and a primer coating, such as a forsterite coating layer, or the interface between the insulating tensile coating layer A and the base steel). Consequently, the coating is readily peeled off during bending and exhibits poor adhesion. More preferably, $\sigma_{A/2}$ is 0.85 times or more of $\sigma_A$. Moreover, $\sigma_{A/2}$ does not cause any particular problem to the upper limit of 1.00 time of $\sigma_A$. However, in view of a difference between the thermal expansion coefficient of a metal and the thermal expansion coefficient of a nonmetal insulating coating, a feasible upper limit of $\sigma_{A/2}$ is considered to be about 0.98 times of $\sigma_A$.

Further, it is preferable to apply as much tension as possible to the steel sheet by the surface layer side of the insulating tensile coating layer A. For this reason, a tension ($\sigma_{A/3}$) applied to the steel sheet by an insulating tensile coating layer having a coating weight of M/3 from the surface of the insulating tensile coating layer A is preferably 0.50 times or more and more preferably 0.60 times or more of $\sigma_A$.

A component material of the insulating tensile coating layer A may be any of nitrides, sulfides, oxides, inorganics, and organics provided that the substance ensures electric insulation and applies a tension. By employing CVD or PVD, it is possible to relatively easily form a film of Al, Cr, Ti, V, Mn, Nb, Hf, Ta, W, a nitride thereof, an oxide thereof, an oxynitride thereof, a carbonitride thereof, or the like.

In view of stress relief annealing, the use in the atmosphere at an ambient pressure, and so forth, the insulating tensile coating layer A preferably and primarily contains an oxide, favorably an inorganic oxide, and particularly preferably primarily contains glass or glass ceramics. The expression "primarily contain" in the disclosure means that the content ratio in the insulating tensile coating layer A is 50 mass % or more relative to the total mass of the insulating tensile coating layer A.

Examples of the oxide include phosphate salts, borate salts, and silicate salts, and silicophosphate glass, which is commonly used today as an insulating tensile coating, is preferably used. Silicophosphate glass has a property of absorbing moisture in the air. To prevent this, it is preferable to include one or more elements selected from Mg, Al, Ca, Ba, Sr, Zn, Ti, Nd, Mo, Cr, B, Ta, Cu, and Mn. Moreover, any suitable element may be included in addition to the above-mentioned elements. For example, to enhance surface smoothness, one or more elements selected from Li and K are preferably included.

Exemplary methods of imparting a gradient in tension applied to a steel sheet within an insulating tensile coating layer A as in the disclosure include a method of forming an insulating tensile coating layer A from a plurality of silicophosphate glass layers with different applied tensions. In this case, the insulating tensile coating layer A is primarily formed from glass.

The simplest method of imparting a gradient in tension applied to a steel sheet within an insulating tensile coating layer A is a method of precipitating, within a vitreous tensile coating, a ceramic phase with a different thermal expansion coefficient (in other words, primarily containing glass ceramics) while controlling the distribution of the ceramic phase. Such control is possible by a method of precipitating a ceramic phase with a high thermal expansion coefficient on the steel sheet side of the insulating tensile coating layer A or a method of precipitating a ceramic phase with a low thermal expansion coefficient on the surface layer side of the insulating tensile coating layer A. However, in view of a tension applied to the steel sheet by the entire insulating tensile coating layer A, a method of precipitating a ceramic phase with low thermal expansion on the surface layer side is preferable.

Crystallization of glass occurs from the inside of glass in some cases and from the glass surface in other cases. In the case of the disclosure, a method of causing crystallization to occur from the glass surface and to grow toward the inside of glass (in other words, the steel sheet side) is most preferably employed.

Further, exemplary methods of forming the above-described glass ceramics as an insulating tensile coating layer A include a method of applying a treatment solution for coating formation containing colloidal silica and at least one selected from Mg, Al, Ca, Ba, Sr, Zn, Ti, Nd, Mo, Cr, Ta, Cu, and Mn salts of phosphoric acid, boric acid, and silicic acid to at least either surface of an electrical steel sheet and subsequently baking by a method described hereinafter. Here, one or more selected from any suitable salt of phosphoric acid, boric acid, and silicic acid, such as Li and K salts of phosphoric acid, boric acid, and silicic acid, may be further added to the treatment solution for coating formation. Moreover, any suitable compound, such as a compound containing one or more selected from Li, K, and Mg, may be further added to the treatment solution for coating formation. Such a suitable compound is preferably an inorganic compound.

Other exemplary methods of forming the above-described glass ceramics include a method of applying a treatment solution for coating formation containing colloidal silica, at least one selected from Mg, Al, Ca, Ba, Sr, Zn, Cr, and Mn salts of phosphoric acid, and a compound containing one or two or more selected from Ti, Nd, Mo, B, Ta, and Cu to at least either surface of an electrical steel sheet and subsequently baking by a method described hereinafter to form an insulating tensile coating layer primarily containing silicophosphate glass ceramics. Here, the above-mentioned compound is preferably an inorganic compound. Moreover, any suitable compound, such as a compound containing one or more selected from Li, K, and Mg, may be further added to the treatment solution for coating formation. Such a suitable compound is preferably an inorganic compound.

When crystallization is caused during baking, the baking temperature of an insulating tensile coating layer A is preferably 800° C. or higher, and a higher temperature is preferable. However, since an excessively high temperature causes creep deformation of a steel sheet itself during baking, the baking temperature is preferably 1,100° C. or lower and more preferably 1,050° C. or lower. Moreover, to cause crystallization at 800° C. or higher, it is required to adjust the composition of a coating solution (treatment solution for coating formation) such that the nucleation temperature is about 600° C. to 700° C. Meanwhile, when crystal nuclei are excessively formed, the rate of crystallization occurring within glass excessively increases. Consequently, it becomes difficult to impart a gradient in tension applied to a steel sheet within an insulating tensile coating layer as in the disclosure. To avoid this, the heating rate in the temperature range of 600° C. or higher and 700° C. or lower is preferably 100° C./s or more and more preferably 150° C./s or more. The upper limit of the heating rate in the temperature range of 600° C. or higher and 700° C. or lower is not particularly limited, but is preferably 400° C./s or less and more preferably 300° C./s or less from a practical viewpoint.

Exemplary methods of further promoting crystallization from the surface includes a method utilizing water. When water permeates into glass, the glass network is cut to lower the viscosity of glass. This makes the movement of atoms easy and accelerates the crystallization rate. To promote crystallization from the glass surface by water during baking at 800° C. or higher, an atmosphere in the temperature range of 700° C. or higher is preferably an atmosphere with a dew point of −20° C. or higher and favorably an atmosphere with a dew point of −15° C. or higher. Meanwhile, an excessively high dew point increases a risk of causing rust on a steel sheet surface. Accordingly, an atmosphere in the temperature range of 700° C. or higher is preferably an atmosphere with a dew point of 10° C. or lower and further preferably an atmosphere with a dew point of 0° C. or lower.

Other exemplary methods of forming an insulating tensile coating layer A having a gradient in tension applied to a steel sheet include, through PVD or CVD, a method of forming a film of Al, Cr, Ti, V, Mn, Nb, Hf, Ta, W, a nitride thereof, an oxide thereof, an oxynitride thereof, or a carbonitride thereof while varying the composition or concentration in the film thickness direction to form a layered structure of ceramics with different thermal expansion coefficients; and a method of continuously changing the composition within a ceramic layer. The thus-formed ceramic layer (insulating tensile coating layer A) has excellent adhesion with the base steel. Accordingly, an insulating tensile coating layer A can be formed directly on the base steel surface without forming a primer coating layer.

A tension applied to a steel sheet by an insulating tensile coating layer A is preferably 10 MPa or more and more preferably 12 MPa or more. By increasing the tension, it is possible to reduce iron loss and to further reduce noise when used for transformers.

The weight of an insulating tensile coating layer A is preferably 2.0 g/m$^2$ or more per surface. Meanwhile, the weight of the insulating tensile coating layer A is preferably 12.0 g/m$^2$ or less per surface. When the coating weight is less than 2.0 g/m$^2$, interlayer insulation somewhat deteriorates. Meanwhile, when the coating weight exceeds 12.0 g/m$^2$, a stacking factor decreases. Here, the stacking factor is a value defined in JIS C 2550. More preferably, the weight of an insulating tensile coating layer A is 3.0 g/m$^2$ or more per surface. And more preferably, the weight of an insulating tensile coating layer A is 8.0 g/m$^2$ or less per surface.

EXAMPLES

Example 1

A silicon steel slab containing, by mass %, Si: 3.25%, C: 0.04%, Mn: 0.08%, S: 0.002%, sol. Al: 0.015%, N: 0.006%, Cu: 0.05%, and Sb: 0.01% was heated at 1,150° C. for 20 minutes and then hot rolled into a 2.4 mm-thick hot-rolled sheet. The hot-rolled sheet was annealed at 1,000° C. for 1 minute and then cold rolled into a final sheet thickness of 0.27 mm. A specimen with a size of 100 mm×400 mm was taken from the central portion of the obtained cold-rolled coil, heated from room temperature to 820° C. at a heating rate of 80° C./s, and subjected to primary recrystallization annealing in a humid atmosphere at 820° C. for 60 seconds. Subsequently, a water slurry prepared from an annealing separator containing 100 parts by mass of MgO mixed with 5 parts by mass of $TiO_2$ was applied to the specimen and dried. The resulting steel sheet was heated from 300° C. to 800° C. in 100 hours, then heated to 1,200° C. at 50° C./hr, and subjected to final finish annealing at 1,200° C. for 5 hours to yield a steel sheet having a primer coating primarily containing forsterite.

Subsequently, the treatment solution for coating formation shown in Table 2 was prepared, and an insulating tensile coating (insulating tensile coating layer A) was formed under the baking conditions shown in Table 3. In other words, an insulating tensile coating layer A was formed on the forsterite primer coating layer in the present Examples. The specific gravity of the treatment solution for coating formation was adjusted to 1.20 by using pure water. The treatment solution was applied by using a roll coater, and the weight of each insulating tensile coating layer A was controlled to 4.50 $g/m^2$ per surface. Moreover, the baking atmosphere was an atmosphere of 100% $N_2$, and a dew point of the atmosphere in the temperature range of 700° C. or higher was set as shown in Table 3.

For the thus-obtained each specimen, the distribution, within the insulating tensile coating layer A, of a tension applied to the steel sheet by the insulating tensile coating layer A was determined by the above-described method. Here, the peeled amount of the insulating tensile coating layer A was controlled by adjusting an immersion time in a 25 mass % NaOH aqueous solution (remover) at 110° C. Moreover, the adhesion of an insulating coating was assessed by a winding method around a round bar. Specifically, the adhesion was assessed, as a minimum diameter without visually observed peeling of a coating (diameter without peeling in bending), by winding a specimen (280 mm in the rolling direction×30 mm in the transverse direction) around a 5 mm-diameter round bar, visually observing the presence or absence of the occurrence of peeling of a coating when winding back by 180°, and assessing in the same manner using round bars with diameters in 5 mm increments. In this assessment, coating adhesion can be considered better as the diameter without peeling in bending is smaller. These results are shown in Table 3 together.

As shown in Table 3, the disclosed embodiments in which $\sigma_{A/2}$ is 0.80 times or more of $\sigma_A$ ($\sigma_{A/2}/\sigma_A$ of 0.80 or more) exhibit excellent coating adhesion of the diameter without peeling in bending of 15 mm or less. Moreover, it is also revealed that further better coating adhesion of the diameter without peeling in bending of 5 mm or less is achieved when $\sigma_{A/2}$ is 0.85 times or more of $\sigma_A$. Concerning the effects of the baking conditions, it is found that an insulating coating with $\sigma_{A/2}/\sigma_A$ of 0.80 or more can be obtained when the conditions of the heating rate of 100° C./s or more in the temperature range of 600° C. or higher and 700° C. or lower and the baking temperature of 800° C. or higher are satisfied.

TABLE 2

| Treatment solution No. | Phosphate salt (g) (as solids content) | | | | | | | | Colloidal silica (g) (as solids content) | Other additives (as solids content) | |
| | Mg phosphate | Ca phosphate | Ba phosphate | Sr phosphate | Zn phosphate | Al phosphate | Mn phosphate | Cr phosphate | | Type | Added amount (g) |
|---|---|---|---|---|---|---|---|---|---|---|---|
| Treatment solution 1 | 100 | — | — | — | — | — | — | — | 50 | $Mg(NO_3)_2 \cdot 6H_2O$ | 50 |
| Treatment solution 2 | — | — | — | — | — | 100 | — | — | 50 | — | — |
| Treatment solution 3 | 50 | — | — | — | — | 50 | — | — | 70 | $TiO_2$ | 5 |
| Treatment solution 4 | — | — | — | — | — | — | — | 100 | 50 | $Nd_2O_3$ | 20 |
| Treatment solution 5 | — | 100 | — | — | — | — | — | — | 100 | $B_2O_3$ | 80 |
| Treatment solution 6 | — | 50 | — | 50 | — | — | — | — | 150 | LiOH | 30 |
| Treatment solution 7 | 50 | — | 50 | — | — | — | — | — | 120 | $K_2SO_4$ | 40 |
| Treatment solution 8 | — | — | — | — | 50 | 50 | — | — | 80 | $Ta_2O_5$ | 2 |
| Treatment solution 9 | 80 | — | — | — | — | — | 20 | — | 80 | $CuSO_4$ | 20 |
| Treatment solution 10 | — | — | — | — | — | 50 | — | 50 | 80 | $MoO_3$ | 10 |
| Treatment solution 11 | — | — | — | — | — | — | — | — | 80 | $Na_2B_4O_5(OH)_4 \cdot 8H_2O$ | 20 |

TABLE 3

| No. | Treatment solution No. | Forming conditions for insulating tensile coating layer A | | | | Applied tension | | | Coating adhesion Diameter without peeling in bending [mm] | Note |
|---|---|---|---|---|---|---|---|---|---|---|
| | | Heating rate in 600° C. to 700° C. [° C./s] | Baking temperature (° C.) | Baking time (s) | Dew point*) [° C.] | $\sigma_A$ [MPa] | $\sigma_{A/2}$ [MPa] | $\sigma_{A/2}/\sigma_A$ | | |
| 1 | 1 | 100 | 900 | 30 | −25 | 10.8 | 8.8 | 0.81 | 15 | Example |
| 2 | 1 | 100 | 900 | 30 | −20 | 10.9 | 9.5 | 0.87 | 5 | Example |
| 3 | 1 | 100 | <u>780</u> | 30 | −20 | 8.2 | 3.6 | <u>0.44</u> | 30 | Comparative Example |
| 4 | 2 | 120 | 800 | 90 | −15 | 9.5 | 7.8 | 0.82 | 10 | Example |
| 5 | 2 | 120 | <u>700</u> | 30 | −15 | 8.0 | 4.1 | <u>0.51</u> | 25 | Comparative Example |
| 6 | 2 | 200 | 820 | 30 | −20 | 10.5 | 9.0 | 0.86 | 5 | Example |
| 7 | 3 | <u>60</u> | 850 | 30 | −10 | 10.2 | 5.3 | <u>0.52</u> | 20 | Comparative Example |
| 8 | 3 | 100 | 880 | 20 | 0 | 12.0 | 9.6 | 0.80 | 10 | Example |
| 9 | 3 | 150 | 880 | 20 | 0 | 12.0 | 11.2 | 0.93 | 5 | Example |
| 10 | 4 | 120 | 850 | 30 | −5 | 10.2 | 8.3 | 0.81 | 10 | Example |
| 11 | 5 | 120 | 850 | 300 | −5 | 9.8 | 7.9 | 0.81 | 10 | Example |
| 12 | 6 | 120 | 900 | 60 | 5 | 10.8 | 9.4 | 0.87 | 5 | Example |
| 13 | 7 | 120 | 900 | 10 | 5 | 10.3 | 9.6 | 0.93 | 5 | Example |
| 14 | 8 | 120 | 900 | 30 | 10 | 11.1 | 9.8 | 0.88 | 5 | Example |
| 15 | 9 | 120 | 1000 | 15 | 10 | 12.3 | 11.3 | 0.92 | 5 | Example |
| 16 | 10 | 120 | 1000 | 120 | −15 | 11.8 | 9.5 | 0.81 | 10 | Example |
| 17 | 11 | 120 | 1000 | 60 | −20 | 12.5 | 11.0 | 0.88 | 5 | Example |
| 18 | 11 | <u>90</u> | 820 | 20 | 0 | 10.1 | 4.9 | <u>0.49</u> | 25 | Comparative Example |

*)Atmosphere in a temperature range of 700° C. or higher
Underlines indicate the outside of the scope of the disclosure Example 2

A silicon steel slab containing, by mass %, Si: 3.25%, C: 0.04%, Mn: 0.08%, S: 0.002%, sol. Al: 0.015%, N: 0.006%, Cu: 0.05%, and Sb: 0.01% was heated at 1,150° C. for 20 minutes and then hot rolled into a 2.2 mm-thick hot-rolled sheet. The hot-rolled sheet was annealed at 1,000° C. for 1 minute, then cold rolled into a final sheet thickness of 0.23 mm, subsequently heated from room temperature to 820° C. at a heating rate of 50° C./s, and subjected to primary recrystallization annealing in a humid atmosphere at 820° C. for 60 seconds. Subsequently, a water slurry prepared from an annealing separator containing 50 parts by mass of MgO mixed with 150 parts by mass of $Al_2O_3$ and 1 part by mass of $Na_2B_4O_7 \cdot 10H_2O$ was applied to the steel sheet and dried. The resulting steel sheet was heated from 300° C. to 800° C. in 100 hours, then heated to 1,200° C. at 50° C./hr, and subjected to final finish annealing at 1,200° C. for 5 hours to prepare a steel sheet having a crystalline coating primarily containing cordierite ($2MgO \cdot 2Al_2O_3 \cdot 5SiO_2$).

The cordierite coating was peeled from the steel sheet (400 mm in the rolling direction×100 mm in the transverse direction) by using mixed acids of sulfuric acid and hydrofluoric acid, and an insulating tensile coating (insulating tensile coating layer A) consisting of 100% TiN on the base steel side, 100% AlN on the surface side, and continuous solid solution of AlTiN therebetween was formed on the steel sheet surface by PVD. In other words, an insulating tensile coating layer A was formed directly on the base steel surface in the present Examples. On this occasion, by changing the ON/OFF timing of the bias voltage for a Ti target and an Al target, samples having insulating coatings with various concentration gradients (Al/Ti ratios) were prepared. Specifically, an insulating coating having a concentration gradient (Al/Ti ratio) within the insulating tensile coating layer A was formed as follows in No. 31 of Table 4, as an example. When the timing at which the bias voltage for a Ti target was turned ON is set to 0 second, voltage was applied to the Ti target from 0 to 400 seconds, whereas voltage was applied to an Al target 300 seconds after the timing at which the bias voltage for the Ti target was turned ON and continued to be applied to 600 seconds, thereby forming such an insulating tensile coating layer A.

For the thus-obtained each sample, the distribution, within the insulating tensile coating layer A, of a tension applied to the steel sheet by an insulating tensile coating layer A was determined by the above-described method. Here, the peeled amount of the insulating tensile coating layer A was controlled by adjusting an immersion time in 35 mass % hydrogen peroxide (remover). Moreover, the adhesion of an insulating coating was assessed in the same manner as Example 1. These results are shown in Table 4 together.

As shown in Table 4, when $\sigma_{A/2}/\sigma_A$ is 0.80 or more, excellent coating adhesion of the diameter without peeling in bending of 10 mm or less is achieved. Moreover, it is revealed that further better coating adhesion of the diameter without peeling in bending of 5 mm or less is achieved when $\sigma_{A/2}/\sigma_A$ is 0.85 or more.

TABLE 4

| | Forming conditions for insulating tensile coating layer A | | | | Applied tension | | | Coating adhesion Diameter without peeling | |
|---|---|---|---|---|---|---|---|---|---|
| | Ti target | | Al target | | | | | | |
| No. | ON [s] | OFF [s] | ON [s] | OFF [s] | $\sigma_A$ [MPa] | $\sigma_{A/2}$ [MPa] | $\sigma_{A/2}/\sigma_A$ | in bending [mm] | Note |
| 31 | 0 | 400 | 300 | 600 | 21.0 | 18.0 | 0.86 | 5 | Example |
| 32 | 0 | 500 | 450 | 600 | 13.5 | 10.5 | <u>0.78</u> | 20 | Comparative Example |
| 33 | 0 | 300 | 300 | 600 | 24.0 | 21.0 | 0.88 | 5 | Example |
| 34 | 0 | 300 | 200 | 600 | 27.0 | 21.0 | <u>0.78</u> | 20 | Comparative Example |
| 35 | 0 | 350 | 280 | 700 | 30.1 | 24.5 | 0.81 | 10 | Example |
| 36 | 0 | 300 | 200 | 500 | 20.0 | 16.0 | 0.80 | 10 | Example |
| 37 | 0 | 200 | 120 | 300 | 11.4 | 9.2 | 0.81 | 10 | Example |
| 38 | 0 | 250 | 150 | 300 | 9.0 | 7.5 | 0.83 | 10 | Example |
| 39 | 0 | 250 | 225 | 450 | 17.3 | 15.0 | 0.87 | 5 | Example |

Underlines indicate the outside of the scope of the disclosure

The invention claimed is:

1. An insulating coating-attached electrical steel sheet comprising:
   the steel sheet, and
   on at least one surface of the steel sheet, an insulating coating including an insulating tensile coating layer A, wherein:
   a tension applied to the steel sheet by an insulating tensile coating layer having a coating weight of M/2 from a surface of the insulating tensile coating layer A is $0.80 \times \sigma_A$ or more, where M is a weight of the insulating tensile coating layer A, and $\sigma_A$ is a tension applied to the steel sheet by the insulating tensile coating layer A.

2. The insulating coating-attached electrical steel sheet according to claim 1, wherein the insulating tensile coating layer A primarily contains glass or glass ceramics.

3. The insulating coating-attached electrical steel sheet according to claim 2, wherein the insulating tensile coating layer A is silicophosphate glass or silicophosphate glass ceramics containing one or more elements selected from Mg, Al, Ca, Ba, Sr, Zn, Ti, Nd, Mo, Cr, B, Ta, Cu, and Mn.

4. The insulating coating-attached electrical steel sheet according to claim 1, wherein the insulating tensile coating layer A is silicophosphate glass or silicophosphate glass ceramics containing one or more elements selected from Mg, Al, Ca, Ba, Sr, Zn, Ti, Nd, Mo, Cr, B, Ta, Cu, and Mn.

5. A method for manufacturing an insulating coating-attached electrical steel sheet comprising the steel sheet, and on at least one surface of the steel sheet, an insulating coating including an insulating tensile coating layer A, wherein:
   a tension applied to the steel sheet by an insulating tensile coating layer having a coating weight of M/2 from a surface of the insulating tensile coating layer A is $0.80 \times \sigma_A$ or more, where M is a weight of the insulating tensile coating layer A, and $\sigma_A$ is a tension applied to the steel sheet by the insulating tensile coating layer A; and the method comprising:
   forming the insulating tensile coating layer A by applying a treatment solution for coating formation containing colloidal silica and at least one selected from Mg, Al, Ca, Ba, Sr, Zn, Ti, Nd, Mo, Cr, Ta, Cu, and Mn salts of phosphoric acid, boric acid, and silicic acid to at least either surface of the electrical steel sheet, subsequently
   heating the coated electrical steel sheet at a heating rate of 100° C./s or more in a temperature range of 600° C. or higher and 700° C. or lower, and then
   baking the heated electrical steel sheet at 800° C. or higher.

6. The method for manufacturing an insulating coating-attached electrical steel sheet according to claim 5, wherein the baking is performed in an atmosphere having: (i) a temperature range of 700° C. or higher and (ii) a dew point of −20° C. or higher and 10° C. or lower.

7. A method for manufacturing an insulating coating-attached electrical steel sheet comprising the steel sheet, and on at least one surface of the steel sheet, an insulating coating including an insulating tensile coating layer A; wherein:
   a tension applied to the steel sheet by an insulating tensile coating layer having a coating weight of M/2 from a surface of the insulating tensile coating layer A is $0.80 \times \sigma_A$ or more, where M is a weight of the insulating tensile coating layer A, and $\sigma_A$ is a tension applied to the steel sheet by the insulating tensile coating layer A; the method comprising:
   forming the insulating tensile coating layer A by applying a treatment solution for coating formation containing colloidal silica, at least one selected from Mg, Al, Ca, Ba, Sr, Zn, Cr, and Mn salts of phosphoric acid, and a compound containing at least one selected from Ti, Nd, Mo, B, Ta, and Cu to at least either surface of the electrical steel sheet, subsequently
   heating the coated electrical steel sheet at a heating rate of 100° C./s or more in a temperature range of 600° C. or higher and 700° C. or lower, and then
   baking the heated electrical steel sheet at 800° C. or higher.

8. The method for manufacturing an insulating coating-attached electrical steel sheet according to claim 7, wherein the baking is performed in an atmosphere having: (i) a temperature range of 700° C. or higher and (ii) a dew point of −20° C. or higher and 10° C. or lower.

* * * * *